United States Patent
Smith, Jr. et al.

(10) Patent No.: US 9,745,458 B2
(45) Date of Patent: Aug. 29, 2017

(54) COMPOSITE SUPPORT MATERIAL FOR THREE-DIMENSIONAL PRINTING

(71) Applicant: Hewlett-Packard Development Company, L.P., Fort Collins, CO (US)

(72) Inventors: Greg S. Smith, Jr., San Diego, CA (US); Ben Wynne, San Diego, CA (US); Guang Jin Li, San Diego, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/904,502

(22) PCT Filed: Jul. 26, 2013

(86) PCT No.: PCT/US2013/052285
§ 371 (c)(1),
(2) Date: Jan. 12, 2016

(87) PCT Pub. No.: WO2015/012862
PCT Pub. Date: Jan. 29, 2015

(65) Prior Publication Data
US 2016/0194492 A1    Jul. 7, 2016

(51) Int. Cl.
| | | |
|---|---|---|
| *B29C 67/00* | (2006.01) | |
| *C08L 29/04* | (2006.01) | |
| *B33Y 70/00* | (2015.01) | |
| *C23C 14/34* | (2006.01) | |
| *B29K 31/00* | (2006.01) | |
| *B29K 67/00* | (2006.01) | |
| *B29L 9/00* | (2006.01) | |

(52) U.S. Cl.
CPC .......... *C08L 29/04* (2013.01); *B29C 67/0092* (2013.01); *B33Y 70/00* (2014.12); *C23C 14/34* (2013.01); *B29K 2031/04* (2013.01); *B29K 2067/046* (2013.01); *B29L 2009/00* (2013.01)

(58) Field of Classification Search
CPC ..... B29C 67/0092; B33Y 70/00; C23C 14/34; C08L 29/04
See application file for complete search history.

(56) References Cited

U.S. PATENT DOCUMENTS

| | | |
|---|---|---|
| 6,070,107 A | 5/2000 | Lombardi et al. |
| 8,227,540 B2 | 7/2012 | Priedeman et al. |
| 8,246,888 B2 | 8/2012 | Hopkins et al. |
| 8,425,218 B2 | 4/2013 | Pettis |
| 8,439,665 B2 | 5/2013 | Batchelder et al. |
| 8,460,451 B2 | 6/2013 | Xu et al. |
| 2012/0070619 A1 | 3/2012 | Mikulak et al. |

FOREIGN PATENT DOCUMENTS

| | | |
|---|---|---|
| EP | 2514775 | 10/2012 |
| IN | 1615KOL2008 | 3/2010 |
| JP | 50118017 | * 9/1975 |
| WO | 2005032802 | 4/2005 |
| WO | 2006011490 | 2/2006 |
| WO | 2013010108 | 1/2013 |

OTHER PUBLICATIONS

International Search Report dated Mar. 26, 2014 for PCT/US2013/052285, Applicant Hewlett-Packard Development Company, L.P.

* cited by examiner

*Primary Examiner* — Mark Kaucher
(74) *Attorney, Agent, or Firm* — Thorpe, North & Western L.L.P.

(57) ABSTRACT

The present disclosure provides composite support material and associated methods used in the fabrication of three-dimensional objects. In one example, a composite support material for three-dimensional printing can include a soluble filament core that is soluble in a solvent and is encapsulated with an insoluble shell that is insoluble in the solvent. The composite support material is stable in air and, when printed, is dissolvable in the solvent.

20 Claims, No Drawings

COMPOSITE SUPPORT MATERIAL FOR THREE-DIMENSIONAL PRINTING

BACKGROUND

Printing technologies can be used to create three-dimensional objects from data output of a computerized modeling source. For example, one can design a three-dimensional object using a computer program, and the computer can output the data of the design to a printing system capable of forming the solid three-dimensional object. More specifically, solid Fused Filament Fabrication (or layer manufacturing) can be defined generally as a fabrication technology used to build a three-dimensional object using layer by layer or point-by-point fabrication. With this fabrication process, complex shapes can be formed without the use of a preshaped die or mold.

Essentially, with such a system, an object can be designed using a computer program, such as a Computer Aided Design (CAD) application. Once the object has been designed three-dimensionally, solid Fused Filament Fabrication technology enables the translation of the computer-generated model into a three-dimensional object. This technology is useful in areas such as verifying a CAD model, evaluating design feasibility, testing part functionality, assessing aesthetics, checking ergonomics of design, aiding in tool and fixture design, creating conceptual models and sales/marketing tools, generating patterns for investment casting, reducing or eliminating engineering changes in production, prototyping, and providing production runs, to name a few.

In this evolving area of technology, there has been a desire to provide new materials and methods of manufacture that are relatively easy to employ, provide rigid structures, and are relatively quick in their formation. Thus, additional methods, systems, and/or compositions that meet these criteria would be an advancement in the art.

DETAILED DESCRIPTION

Fused Filament Fabrication (FFF) is an additive manufacturing technology commonly used for modeling, prototyping, and production applications. FFF works on an "additive" principle by laying down material in layers. A filament of plastic or other material is unwound from a coil and supplies material to an extrusion nozzle which can turn the flow on and off. The nozzle is heated to melt the material and can be moved in both horizontal and vertical directions by an XYZ control system. The model or part is produced by extruding small beads of thermoplastic material to form layers as the material hardens immediately after extrusion from the nozzle. Stepper motors or servo motors are typically employed to move the extrusion head. For areas not intended to become part of the model, other support materials are used in the layering. These support materials can be mechanically removed or dissolved after printing and solidification is finished.

It has been recognized that 3D printed objects can be printed using Fused Filament Fabrication with a composite support material that can be removed without traditional mechanical techniques. Such use can eliminate the need for inconvenient or difficult mechanical removal techniques, can provide a cleaner printed object, and can provide a sharper well-defined printed object. Thus, a safer, easier to use, and more efficient printing system can be provided. In accordance with this, compositions and methods are directed to the incorporation and use of a composite support material providing the benefits discussed herein. It is noted that when discussing the present composite support materials and associated methods, each of these discussions can be considered applicable to each of these examples, whether or not they are explicitly discussed in the context of that example. Thus, for example, in discussing a soluble filament core in a composite support material, such a soluble filament core can also be used in a method of manufacturing a composite support material, and vice versa.

With the above in mind, a composite support material for three-dimensional printing can include a soluble filament core that is soluble in a solvent, and which is encapsulated with an insoluble shell that is insoluble in the solvent. The composite support material is stable in air and, once printed, is dissolvable in the solvent. As such, the present composite support material generally includes a core/shell structure where the shell protects the composite support material until the composite support material is printed. When printed from a 3D printer, the shell is crushed during extrusion and layering of the composite support material. The act of printing thus exposes the core for subsequent removal by a solvent. As such, the present composite support material can be designed to have a core that is soluble in any number of solvent systems with a shell that is insoluble to such solvents.

Generally, the solvent can be any solvent or solvent system capable of dissolving the core of the composite support material. In one example, the solvent can be an aqueous solvent. In one aspect, the solvent can be water. In another example, the solvent can be an organic solvent. Of course, such solvents can further include co-solvents, additives, buffers, pH modifiers, viscosity modifiers, biocides, surfactants, water-softening salts, etc.

The soluble filament core can include a core polymeric material. The core polymeric material can include any polymer that can be extruded and dissolved in a solvent. In one example, the core polymeric material can include a sugar, a starch, a polyolefin oxide, a polyvinyl alcohol, a polyethylene oxide, a polypropylene oxide, a polyvinylpyrrolidone, an ethylene vinyl alcohol, or a mixture thereof. Such a polyolefin oxide can include a polyethylene oxide, a polypropylene oxide, a polybutylene oxide, etc.

Generally, the insoluble shell can include a shell polymeric material. The shell polymeric material can include any polymer or material that is insoluble in a solvent. In one example, the shell polymeric material can include an acrylonitrile butadiene styrene, a polylactic acid, a polycarbonate, a polystyrene, a nylon, a metal, or a mixture thereof. In one aspect, the metal can include gold, silver, cobalt, chromium, copper, iron, molybdenum, nickel, palladium, platinum, tantalum, tungsten, mixtures thereof, or alloys thereof.

The composite support material can be sized and shaped as desired to comply with any number of printing systems. In one example, the composite support material can be a cylindrical filament having a diameter of ranging from 1 mm to 5 mm. Any cross-sectional shape can be used as well as filaments having a diameter lower than 1 mm, including those in the micron range. For example, the filament can have a diameter ranging from 100 microns to 1 mm, or less than 100 microns. Additionally, the composite support material can generally include 50 weight % to 99 weight % of the soluble filament core. In one example, the composite support material can include 90 weight % to 99 weight % of the soluble filament core, and in one specific aspect, from 94 weight % to 96 weight %. Further, the composite support material can generally include 1 weight % to 50 weight % of the insoluble shell. In one example, the composite support material can generally include 1 weight % to 10 weight % of the insoluble shell, and in one specific aspect, from 4 weight % to 6 weight %. Typically, the soluble filament core is encapsulated by the insoluble shell. As such, in one example, the composite support material can include a soluble filament core uniformly coated with an insoluble shell.

As discussed herein, the present composite support material can be stable prior to use. Generally, the composite support material can be stable in air, thereby providing excellent shelf life. Such stability can be compared to non-composite materials that do not have a shell. Notably, such non-composite materials can readily adsorb water or be otherwise affected by air such that the non-composite materials do not print as well as the present composite support materials. Differences in printing can include fouling of the printing equipment, undesirable flaws in the printed material, slower printing, etc. In one example, stable in air can be measured as gaining 30% less weight over a 24 hour period than a non-composite support material that is the same as the composite support material except that it does not have the insoluble shell. In another example, stable in air can be measured as gaining 50% less weight over a 24 hour period.

In one specific example, a composite support material for three-dimensional printing that is insoluble in an aqueous solvent can include a soluble filament core that is soluble in the aqueous solvent, the soluble filament core including a core polymeric material, the core polymeric material including a sugar, a starch, a polyvinyl alcohol, a polyethylene oxide, a polyvinylpyrrolidone, or a mixture thereof; and an insoluble shell encapsulating the soluble filament core, the insoluble shell including a shell polymeric material, the shell polymeric material including an acrylonitrile butadiene styrene, a polylactic acid, a polycarbonate, a polystyrene, a nylon, a metal, or a mixture thereof, wherein the insoluble shell is insoluble in the aqueous solvent. The present composite support material can be dissolved in water once printed.

A method of manufacturing a support material for three-dimensional printing that is insoluble in a solvent can include coating a soluble filament core that is soluble in the solvent with an insoluble shell that is insoluble in the solvent. The support material is generally stable in air and, when printed, is dissolvable in the solvent.

The coating can be performed by numerous techniques. For example, coating can includes dip-coating the soluble filament core with a solution containing materials that form the insoluble shell, coextruding materials that form the insoluble shell with the soluble filament core; or depositing materials that form the insoluble shell on to the soluble filament core. Regarding deposition, such methods can include physical vapor deposition including sputtering, chemical vapor deposition, atomic layer depositions, etc. In one example, depositing can include sputtering the materials.

Such composite support materials can be printed from a 3D printer, including a fused deposition modeling printer, allowed to cure, and then submersed, or otherwise contacted, with a solvent to remove the composite support material. As such, the printed 3D object can be sprayed, immersed, coated, etc. with the solvent. Such contacting can also include agitating the 3D object in the presence of the solvent.

It is to be understood that this disclosure is not limited to the particular process steps and materials disclosed herein because such process steps and materials may vary somewhat. It is also to be understood that the terminology used herein is used for the purpose of describing particular Examples only. The terms are not intended to be limiting because the scope of the present disclosure is intended to be limited only by the appended claims and equivalents thereof.

It is be noted that, as used in this specification and the appended claims, the singular forms "a," "an," and "the" include plural referents unless the context clearly dictates otherwise.

As used herein, "about" refers to a degree of deviation based on experimental error typical for the particular property identified. The latitude provided the term "about" will depend on the specific context and particular property and can be readily discerned by those skilled in the art. The term "about" is not intended to either expand or limit the degree of equivalents which may otherwise be afforded a particular value. Further, unless otherwise stated, the term "about" shall expressly include "exactly," consistent with the discussion below regarding ranges and numerical data.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3.5, and 4 and sub-ranges such as from 1-3, from 2-4, and from 3-5, etc. Additionally, a numerical range with a lower end of "0" can include a sub-range using "0.1" as the lower end point.

EXAMPLES

The following examples illustrate embodiments of the compositions, methods and systems that are presently known. However, it is to be understood that the following are only exemplary or illustrative of the application of the principles of the present disclosure. Numerous modifications and alternative compositions, methods, and systems may be devised by those skilled in the art without departing from the spirit and scope of the present compositions, methods, and systems. The appended claims are intended to cover such modifications and arrangements. Thus, while the present disclosure has been set forth with particularity, the following examples provide further detail in connection with what are presently deemed to be the acceptable examples.

Example 1

Composite Support Material #1

A composite support material that is stable in air and dissolvable in water after printing was manufactured by dissolving polystyrene chips in methyl ethyl ketone (MEK) and forming a coating lacquer. That solution was then placed in a beaker with a small hole in the bottom and pierced rubber septum thus allowing the beaker to be drawn up then down a polyvinyl alcohol filament. The withdrawal of the filament left a thin, uniform layer of polystyrene on the exterior. The coated filament was approximately 1.75 mm in diameter with about 4-6 weight % polystyrene and about 94-96 weight % polyvinyl alcohol. Even with cracking resulting from uncontrolled air-drying, the rate moisture diffusion was greatly decreased relative to the uncoated control filament of polyvinyl alcohol, as discussed in Example 6 below. Various industrial-scale, continuous dip-coating process are known in the industry and can be used. Typically, the shell's solvent does not dissolve the core filament.

Example 2

Composite Support Material #2

A composite support material that is stable in air and dissolvable in water after printing is manufactured by sputtering platinum using Cressington 208HR sputtering machine (available from Cressington Scientific Instruments Ltd.) under vacuum with argon at manufacturing specified conditions for platinum.

Example 3

Composite Support Material #3

A composite support material that is stable in air and dissolvable in water after printing is manufactured by the same processes as above but with ABS dissolved in acetone as the shell's lacquer.

Example 4

Composite Support Material #4

A composite support material that is stable in air and dissolvable in an organic solvent after printing is manufactured by same processes as above but with polylactic acid polymer dissolved in tetrahydryfuran (THF).

Example 5

3D Printed Object

The composite support material from Example 1 is used with polylactic acid structural material (available from Makerbot) in a 3D printer (MakerBot Replicator™ 2X available from Makerbot) to print a 3D printed object. After printing, the 3D printed object is submersed in water and slightly agitated for 5 minutes. The composite support material is removed and the 3D printed object is obtained in final form.

Example 6

Stability Data

The composite support materials from Example 1 and Example 2 were tested for air stability compared to bare filaments not coated with a shell. Notably the bare filaments were obtained by different manufacturers, thereby providing different moisture uptakes for each bare filament. Example 1 used Bare Filament #1 (polyvinyl alcohol (PVOH) from MakerBot) and Example 2 used Bare Filament #2 (polyvinyl alcohol (PVOH) from Ultimaker). The results are provided in Table 1.

TABLE 1

|  | Example 1 | Bare Filament #1 | Example 2 | Bare Filament #2 |
| --- | --- | --- | --- | --- |
| Moisture Uptake (μg/(hr * mm)) | 8.6 | 15.2 | 8.3 | 10.6 |

As shown in the Table 1, the present composite support materials have a far smaller moisture uptake than the bare filament. The testing procedures included acclimating the filaments by sealing the filaments in a plastic bag for approximately 1 hour at 32° C. and 20% relative humidity. Removing the filaments and taking an initial weight. Exposing the filaments to an environment of 30° C. and 80% relative humidity for 24 hours and recording a final weight. The moisture uptake was measured by taking the delta of the weight (final weight−initial weight) converting to μg, dividing by 24 hours, and dividing that rate by the length of the filament in mm to yield μg/(hr*mm).

Additionally, platinum sputtered filaments using MakerBot PVOH filament and Ultimaker PVOH filament were studied and compared to comparable filaments, i.e., bare filament before sputtering. The platinum sputtered filaments were prepared in accordance with Example 2. The filaments were studied for % reduction in moisture diffusion measured as mg/(hr*mm). The filaments were acclimated for 90 minutes as described above but tested at two different temperature and humidity levels; 30° C. and 80% relative humidity for 24 hours as described above and at 15° C. and 20% relative humidity for 24 hours. The results are listed in Table 2.

TABLE 2

|  | Pt Sputtered PVOH Ultimaker | Pt Sputtered PVOH MakerBot |
| --- | --- | --- |
| Moisture Uptake % difference at 30° C./80 RH | −68 | −157 |
| Moisture Uptake % difference at 15° C./20 RH | −61 | −61 |

−Negative sign indicates % decrease in uptake compared to bare filament

As shown in Table 2, the present coated filaments had a much smaller moisture uptake compared to the bare filament. The present results showed improvement over two vastly different temperature/moisture thresholds.

While the disclosure has been described with reference to certain examples, those skilled in the art will appreciate that various modifications, changes, omissions, and substitutions can be made without departing from the spirit of the disclosure. It is intended, therefore, that the present disclosure be limited only by the scope of the following claims.

What is claimed is:

1. A composite support material for three-dimensional printing, comprising a soluble filament core that is soluble in a solvent and is encapsulated with an insoluble shell that is insoluble in the solvent, wherein the composite support material is stable in air and, when printed, is dissolvable in the solvent, and wherein the solvent is an aqueous solvent or an organic solvent.

2. The composite support material of claim 1, wherein the solvent is the aqueous solvent.

3. The composite support material of claim 1, wherein the solvent is the organic solvent.

4. The composite support material of claim 1, wherein the soluble filament core comprises a core polymeric material, the core polymeric material comprising a sugar, a starch, a polyolefin oxide, a polyvinyl alcohol, a polyvinylpyrrolidone, an a copolymer of ethylene and vinyl alcohol, or a mixture thereof.

5. The composite support material of claim 1, wherein the insoluble shell comprises a metal or a shell polymeric material, the shell polymeric material comprising an acrylonitrile-butadiene-styrene copolymer, a polylactic acid, a polycarbonate, a polystyrene, a nylon, or a mixture thereof.

6. The composite support material of claim 1, wherein the soluble filament core comprises 50 weight % to 99 weight % of the composite support material and the insoluble shell comprises 1 weight % to 50 weight % of the composite support material.

7. The composite support material of claim 1, wherein stable in air is measured as gaining 30% less weight over a 24 hour period than a non-composite support material that is the same as the composite support material except that it does not have the insoluble shell.

8. A composite support material for three-dimensional printing that is insoluble in an aqueous solvent, comprising:
a soluble filament core that is soluble in the aqueous solvent, the soluble filament core comprising a core polymeric material, the core polymeric material including a sugar, a starch, a polyolefin oxide, a polyvinyl alcohol, a polyvinylpyrrolidone, an a copolymer of ethylene and vinyl alcohol, or a mixture thereof; and
an insoluble shell encapsulating the soluble filament core, the insoluble shell comprising a metal or a shell polymeric material, the shell polymeric material including an acrylonitrile-butadiene-styrene copolymer, a polylactic acid, a polycarbonate, a polystyrene, a nylon, or a mixture thereof, wherein the insoluble shell is insoluble in the aqueous solvent.

9. The composite support material of claim 8, wherein the soluble filament core comprises 50 weight % to 99 weight % of the composite support material and the insoluble shell comprises 1 weight % to 50 weight % of the composite support material.

10. The composite support material of claim 8, wherein the composite support material is stable in air and, when printed, is dissolvable in the aqueous solvent.

11. The composite support material of claim 10, wherein stable in air is measured as gaining 30% less weight over a 24 hour period than a non-composite support material that is the same as the composite support material except that it does not have the insoluble shell.

12. A method of manufacturing a composite support material for three-dimensional printing, comprising coating a soluble filament core that is soluble in a solvent with an insoluble shell that is insoluble in the solvent, wherein the composite support material is stable in air and, when printed, is dissolvable in the solvent, wherein the solvent is an aqueous solvent or an organic solvent.

13. The method of claim 12, wherein the coating includes dip-coating the soluble filament core with a solution to form the insoluble shell, coextruding the insoluble shell with the soluble filament core; or depositing the insoluble shell on to the soluble filament core.

14. The method of claim 13, wherein the depositing includes sputtering the materials.

15. The method of claim 13, wherein the solvent is the aqueous solvent.

16. The composite support material of claim 1, wherein the solvent is water.

17. The composite support material of claim 1, wherein the polyolefin oxide is polyethylene oxide, polypropylene oxide, or a mixture thereof.

18. The composite support material of claim 5, wherein the insoluble shell is the shell polymeric material.

19. The composite support material of claim 8, wherein the polyolefin oxide is polyethylene oxide, polypropylene oxide, or a mixture thereof.

20. The composite support material of claim 8, wherein the insoluble shell is the shell polymeric material.

* * * * *

UNITED STATES PATENT AND TRADEMARK OFFICE
CERTIFICATE OF CORRECTION

PATENT NO. : 9,745,458 B2  
APPLICATION NO. : 14/904502  
DATED : August 29, 2017  
INVENTOR(S) : Greg S. Smith et al.

Page 1 of 1

It is certified that error appears in the above-identified patent and that said Letters Patent is hereby corrected as shown below:

On the Title Page

Inventors section, "Greg S. Smith, Jr." should be --Greg S. Smith--.

Signed and Sealed this  
Twenty-sixth Day of December, 2017

Joseph Matal  
*Performing the Functions and Duties of the*  
*Under Secretary of Commerce for Intellectual Property and*  
*Director of the United States Patent and Trademark Office*